United States Patent
Yi et al.

(10) Patent No.: US 6,395,571 B1
(45) Date of Patent: May 28, 2002

(54) METHOD FOR FABRICATING POLYSILICON TFT

(75) Inventors: Jong Hoon Yi; Sang Gul Lee, both of Seoul (KR)

(73) Assignee: LG. Philips LCD Co., Ltd., Seoul (KR)

( * ) Notice: Subject to any disclaimer, the term of this patent is extended or adjusted under 35 U.S.C. 154(b) by 0 days.

(21) Appl. No.: 09/665,119

(22) Filed: Sep. 20, 2000

(30) Foreign Application Priority Data

Sep. 20, 1999 (KR) ............................................. 99-40371

(51) Int. Cl.[7] .............................................. H01L 21/00
(52) U.S. Cl. ......................... 438/30; 438/231; 438/303; 438/608; 438/609
(58) Field of Search ......................... 438/30, 144, 231, 438/303, 608, 609

(56) References Cited

U.S. PATENT DOCUMENTS 5,989,945 A * 11/1999 Yudasaka et al. ........... 438/149
6,156,598 A * 12/2000 Zhou et al. .................. 438/231

* cited by examiner

Primary Examiner—David Nelms
Assistant Examiner—Reneé R Berry
(74) Attorney, Agent, or Firm—Long Aldridge & Norman, LLP

(57) ABSTRACT

Fabrication of a polysilicon TFT having a lightly doped drain or offset structure. Fabrication includes forming a semiconductor layer, a gate insulating film, and a gate electrode on a substrate. Then, forming lightly doped impurity regions in the semiconductor layer on both sides of the gate electrode. Next, forming an insulating film having a thickness that gradually becomes thinner away from the gate electrode. Then, forming heavily doped impurity regions in the lightly doped impurity regions in the semiconductor layer on both sides of the gate, resulting in regions with continuously varied impurity concentrations.

45 Claims, 10 Drawing Sheets

METHOD FOR FABRICATING POLYSILICON TFT

BACKGROUND OF THE INVENTION

1. Field of the Invention

The present invention relates to a method for fabricating a thin film transistor (TFT), and more particularly, to a method for fabricating a polysilicon TFT suitable for use in an active matrix LCD.

2. Background of the Related Art

Active matrix LCDs used as flat displays in portable computers use thin film transistors (TFTS) as switching devices. Although a polysilicon TFT has better switching performance than an amorphous silicon TFT, the polysilicon TFT has a problem of high leakage in the off state. Structures which can solve the problem of high leakage include the lightly doped drain (LDD) structure and the offset structure.

The LDD structure has lightly doped drain regions between heavily doped drain and source regions, and a channel region. The offset structure has offset regions with no impurity between heavily doped drain and source regions, and a channel region. A related art method of fabricating a polysilicon TFT having an LDD or OFFSET structure requires additional mask and fabrication processes for forming LDD regions or offset regions. Production costs of such polysilicon TFTs are high as the TFT has a complicated fabrication process. Additionally, as the LDD or offset structure has an impurity concentration discontinuity at a boundary of the LDD or offset region, leakage reduction is less than optimal. While it is desirable that there is a continuity of the impurity concentration from the LDD or offset region to the heavily doped impurity region, there has been no appropriate process for obtaining such a structure.

SUMMARY OF THE INVENTION

Accordingly, the present invention is directed to a method for fabricating a polysilicon TFT having a lightly doped drain (LDD) structure or an offset structure that substantially obviates one or more of the limitations and disadvantages of the related art.

An advantage of the present invention is to provide a method of fabricating a polysilicon TFT having a continuous LDD structure using a simple fabrication process, and which results in reduced leakage.

Another advantage of the present invention is to provide a method for fabricating a polysilicon TFT having a continuous offset structure using a simple fabrication process, and which results in reduced leakage.

Additional features and advantages of the invention will be set forth in the description that follows, and in part will be apparent from the description, or may be learned by practice of the invention. The objectives and other advantages of the invention will be realized and attained by the structure particularly pointed out in the written description and claims hereof as well as shown in the appended drawings.

To achieve these and other advantages and in accordance with the purpose of the present invention, as embodied and broadly described, a method for fabricating a TFT includes the steps of (a) forming a semiconductor layer, a gate insulating film, and a gate electrode on a substrate, (b) forming lightly doped impurity regions in the semiconductor layer on both sides of the gate electrode, (c) forming an insulating film with a thickness that gradually becomes thinner as the distance from the gate electrode increases, and (d) forming heavily doped impurity regions in the lightly doped impurity regions such that regions having continuously varying impurity concentrations are formed.

In another aspect of the present invention, there is provided a method of fabricating a TFT, including the steps of (a) forming a semiconductor layer, a gate insulating film, and a gate electrode on a substrate, (b) forming an insulating film having a thickness that gradually becomes thinner away from each side of the gate electrode, and (d) forming heavily doped impurity regions in the semiconductor layer, except at specific regions adjacent to the gate electrode, by injecting impurity ions through the insulating film.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to the illustrated embodiments of the present invention, examples of which are found in the accompanying drawings. FIGS. 1A to 1E illustrate cross-sections of a TFT during the fabrication of a polysilicon TFT having a continuous LDD structure in accordance with a first preferred embodiment of the present invention.

Figure 1A:
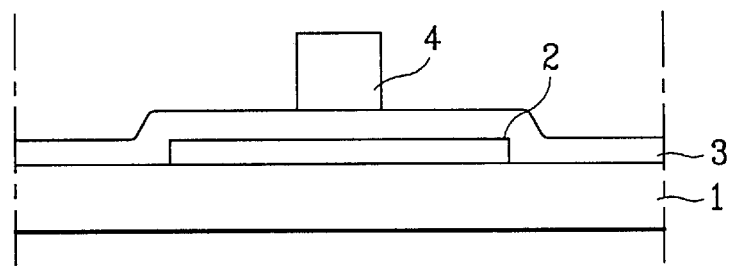
FIGS. 1A to 1E illustrate cross-sections of a TFT during the fabrication of a polysilicon TFT having a continuous LDD structure in accordance with a first preferred embodiment of the present invention.
Figure 1B:
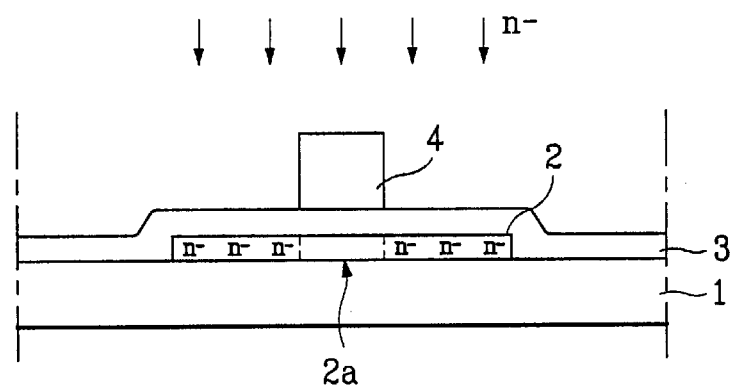
Figure 1C:
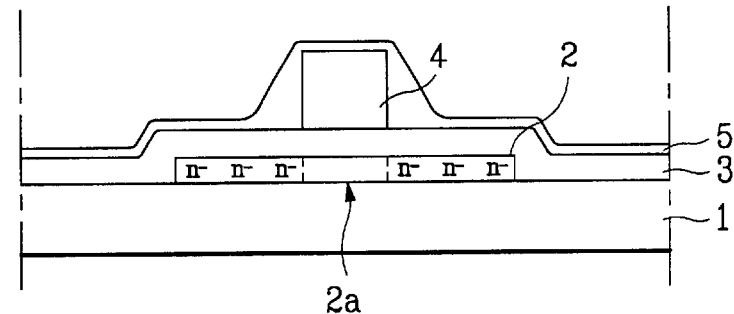

Referring to FIG. 1A, an active semiconductor layer 2, a gate insulating film 3, and a gate electrode 4 are formed in succession on a substrate 1, beneficially of a transparent glass. The active semiconductor layer 2 is formed by forming and patterning a polysilicon layer on the substrate 1, the gate insulating film 3 is formed by sputtering an inorganic insulating film, such as SiNx or SiOx, and the gate electrode 4 is formed by sputtering a metal film, such as Al or Al alloy, and then subjecting the metal film to patterning by photolithography. Then, as shown in FIG. 1B, an n⁻ doping ion is put in the active semiconductor layer 2, except under the gate electrode 4, to form lightly doped n⁻ regions. The gate electrode acts as a mask, resulting in an undoped channel region 2a under the gate electrode 4. Then, as shown in FIG. 1C, an organic material, such as methyl-polysilazane (MSZ), is spin coated onto the structure to form a spin-on-glass (SOG) layer 5. As shown in FIG. 1C, the SOG layer 5 on the gate insulating film 3, which is provided for forming an impurity region of continuously varied concentration, as will be explained in more detail subsequently, is tapered such that the thickness of the SOG layer 5 becomes thinner away from the gate electrode 4. That is, the SOG layer 5 has a thickness almost the same with the gate electrode 4 near the sides of the gate electrode 4, but becomes thinner gradually and continuously away from the sides. The thickness eventually becomes approx. 200 Å far from the gate electrode 4 in the peripheral region of the semiconductor layer 2.

The MSZ of the SOG layer 5 has a high photosensitivity and a high resolution. Furthermore, it can prevent hillocks at the gate electrode caused by high temperatures as MSZ has a high heat resistance. Additionally, since the polysilazane has a balanced low viscosity and surface tension, the SOG layer of the polysilazane readily forms the continuous taper shown in FIG. 1C.

Figure 1D:
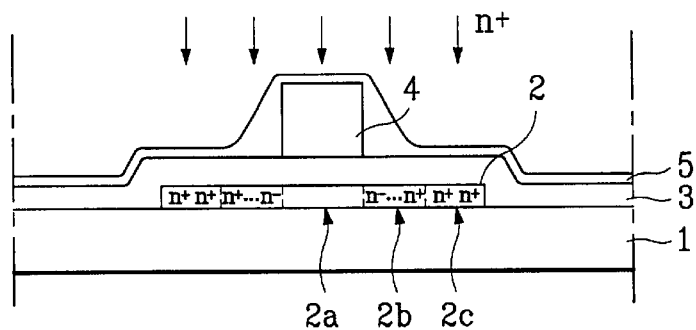

Then, as shown in FIG. 1D, an n⁺ doping is performed onto the structure with the n⁺ impurity ions being heavily injected. As shown in FIG. 1F, the concentration 'I' of the heavily doped impurity ions in the active semiconductor layer 2 is dependent on the thickness of the SOG layer 5, the closer to the gate electrode 4, the lighter the concentration, and the farther from the gate electrode 4, the heavier the concentration. Therefore, at the periphery of the semiconductor layer is a heavily doped region 2c, between the channel region 2a and the heavily doped impurity region 2c is an impurity region 2b having a continuously varied concentration. That impurity concentration gradually varies from a lightly doped impurity region near the gate, to a heavily doped impurity region away from the gate.

Figure 1E:
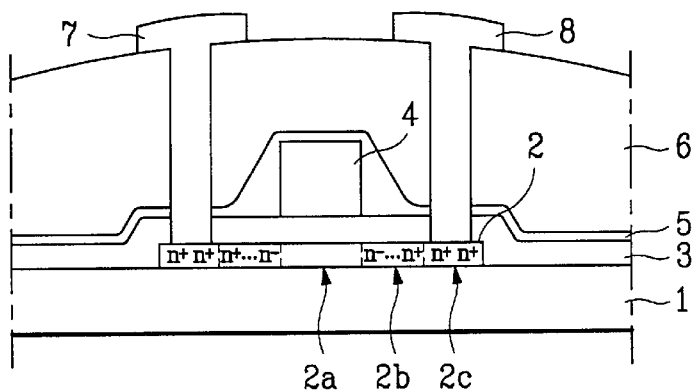
Figure 1F:
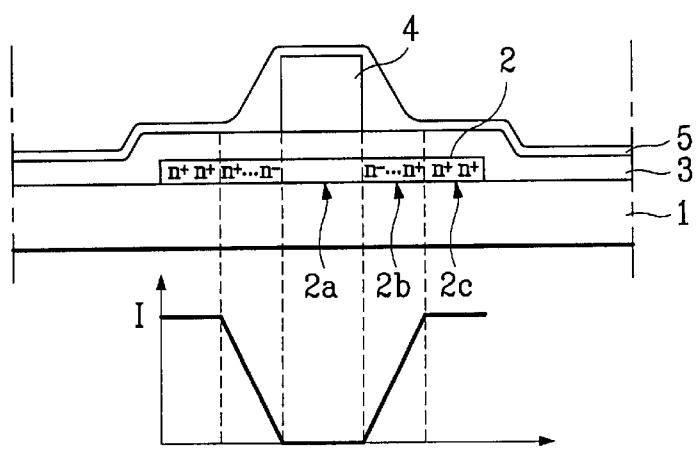
FIG. 1F illustrates the thickness of a spin coated layer versus a doping concentration of impurity ions.

Then after annealing, using a laser or by heat treatment, as shown in FIG. 1E, an insulating film 6 of SiOx or SiNx is formed, contact holes are formed therein, and a metal film of Al or Cr is then formed and patterned to form a source electrode 7 and a drain electrode 8. Thus the first embodiment polysilicon TFT, which has a continuous varied LDD structure, is complete.

Because the first embodiment polysilicon TFT has an impurity region with a continuously varied impurity concentration between the channel region 2a and the heavily doped impurity region 2c, in which the impurity concentration varies continuously from a lightly doped impurity region near the gate electrode, to a heavily doped impurity region away from the electrode, the first embodiment polysilicon TFT has excellent leakage current prevention. Furthermore, unlike related art LDD structures, the first embodiment polysilicon TFT requires no additional mask for the lightly doped impurity regions.

FIGS. 2A to 2F illustrate cross-sections of a TFT during the fabrication of a polysilicon TFT having a continuous LDD structure in accordance with a second embodiment of the present invention.

Figure 2A:
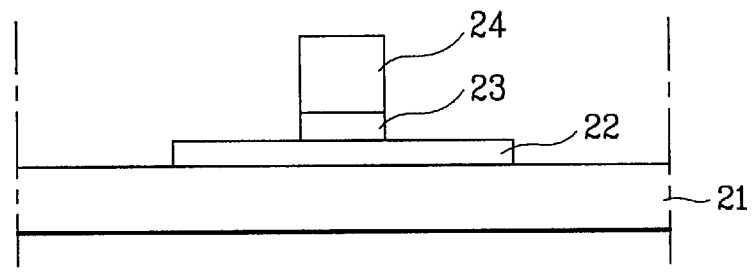
FIGS. 2A to 2F illustrate cross-sections of a TFT during the fabrication of a polysilicon TFT having a continuous LDD structure in accordance with a second preferred embodiment of the present invention.
Figure 2B:
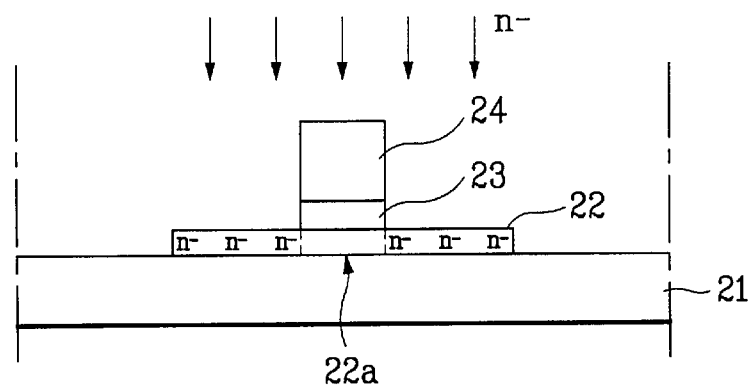
Figure 2C:
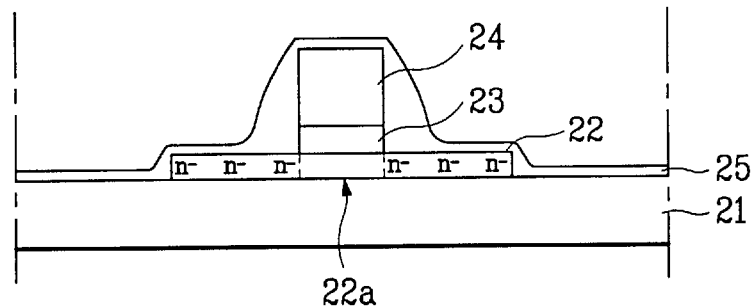

Referring to FIG. 2A, an active semiconductor layer 22, a gate insulating film 23, and a gate electrode 24 are formed on a substrate 21. In this case, unlike the first embodiment, the gate insulating film 23 and the gate electrode 24 are patterned to have the same width. Then, as shown in FIG. 2B, an n⁻ doping material is lightly doped into the active semiconductor layer 22. In this case, a channel region 22a is formed under the gate electrode 24. Then, as shown in FIG. 2C, MSZ is spin coated to form an SOG layer 25. As shown in the drawings, the SOG layer 25 is formed such that the thickness of the SOG layer 25 is thicker, closer to the sides of the gate electrode 24, having almost the same thickness as the gate electrode 24 close to the sides, and thinner away from the gate electrode until the thickness is approx. 200 Å at the periphery of the active semiconductor layer 22.

Figure 2D:
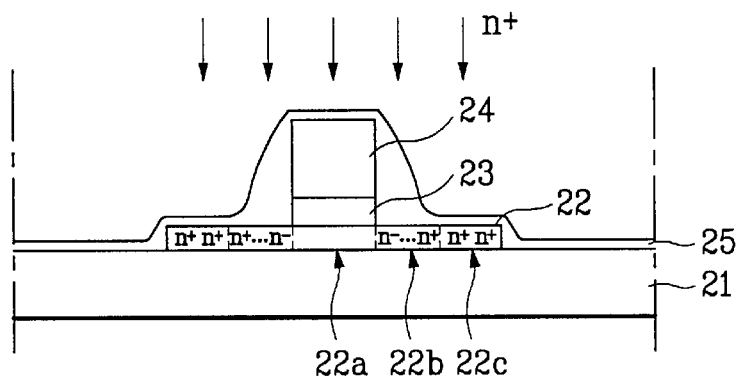

Then, as shown in FIG. 2D, an n⁺ doping is performed on the structure such that the impurity ions are heavily doped. The peripheral regions of the active semiconductor layer 22 become heavily doped impurity regions 22c, and the regions 22b between the channel region 22a and the heavily doped impurity regions 22c have a continuously varied impurity concentration.

Figure 2E:
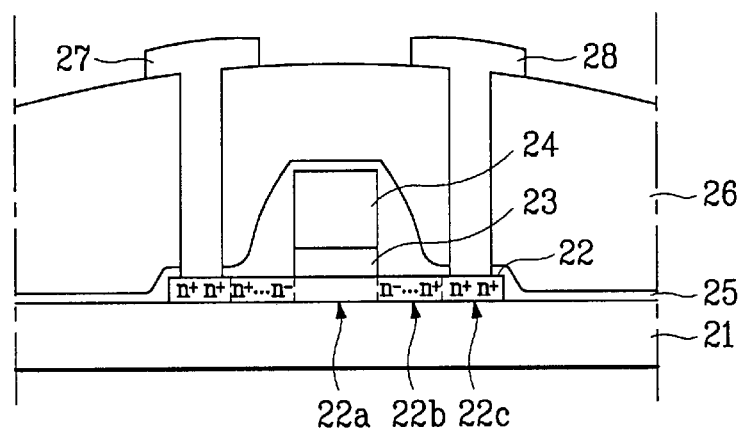

Then, after annealing using a laser beam or heat treatment, as shown in FIG. 2E, an insulating film 26 of SiOx or SiNx is formed. Contact holes are formed to expose the heavily doped impurity regions 22c, and a metal film of Al or Cr is sputtered and patterned to form a source electrode 27 and a drain electrode 28, thereby completing the polysilicon TFT in accordance with the second embodiment of the present invention.

Figure 2F:
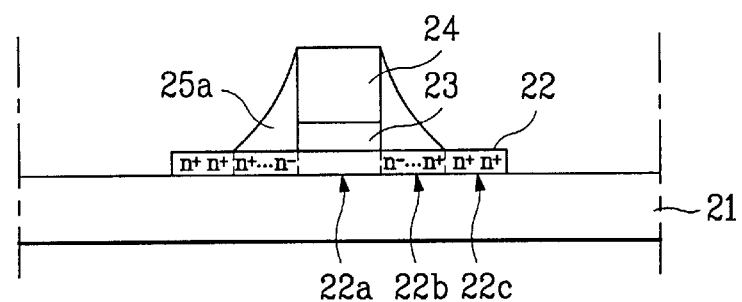

If desired, as shown in FIG. 2F, before the n⁺ doping is performed on the second embodiment, an ashing process can be used to remove 200 Å of the SOG layer 25.

FIGS. 3A to 3D illustrate cross-sections of a TFT during the fabrication of a polysilicon TFT having a continuous offset structure in accordance with a third embodiment of the present invention.

Figure 3A:
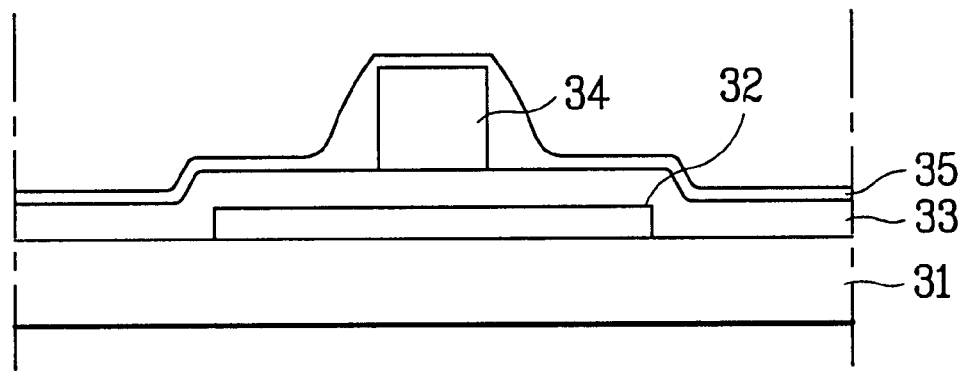
FIGS. 3A to 3D illustrate cross-sections of a TFT during the fabrication of a polysilicon TFT having a continuous offset structure in accordance with a third preferred embodiment of the present invention.

Referring to FIG. 3A, after an active semiconductor layer 32, a gate insulating film 33, and a gate electrode 34 are formed on a substrate 31 as in the first embodiment, MSZ is spin coated on the structure, to form an SOG layer 35. As shown in FIG. 3A, the SOG layer 35 on the gate insulating film 33 is thicker near the sides of the gate electrode 34, with the thickness being almost the same as the thickness of the gate electrode 34 close to the gate electrode, and thinner away from the side, until the thickness is approx. 200 Å at peripheral portions of the active semiconductor layer 32.

Figure 3B:
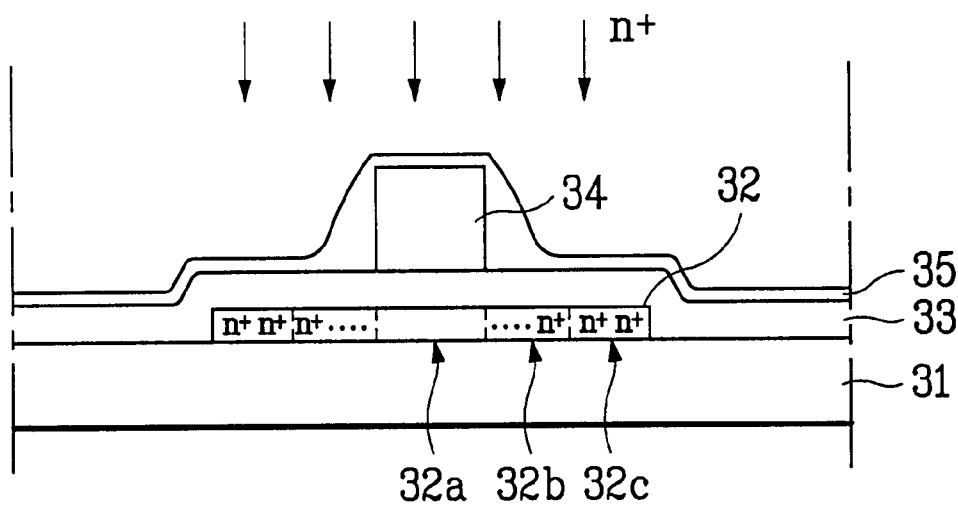

Then, as shown in FIG. 3B, an n+doping is performed in which impurity ions are heavily doped. The region of the active semiconductor layer 32 under the gate electrode 34 forms a channel region 32a, and peripheral regions are turned into heavily doped impurity regions 32c, and between them are regions 32b having continuously varied impurity concentrations. An offset region near the gate, with almost no impurity ions, is gradually converted into a heavily doped impurity region away from the gate.

Figure 3C:
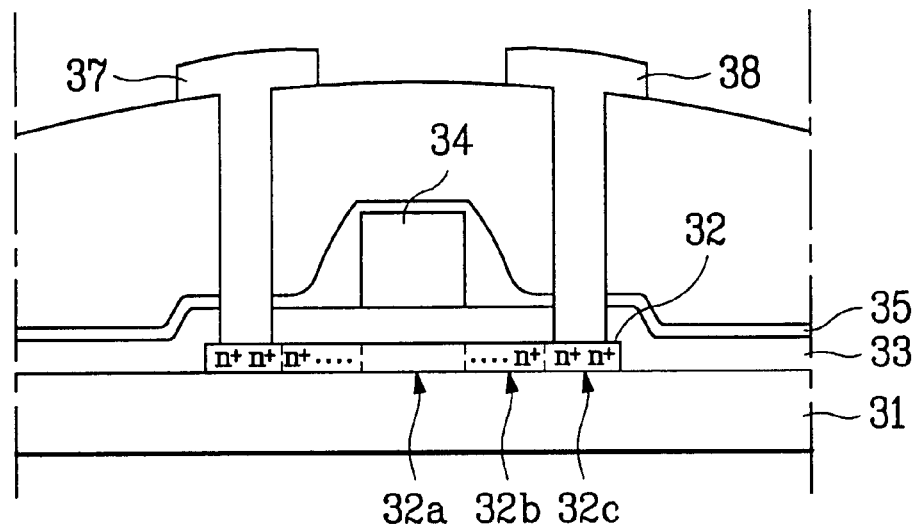

Then, after performing annealing by using a laser beam or by heat treatment, as shown in FIG. 3C, an insulating film 36 of SiOx or SiNx is formed, contact holes are formed therein, and a metal film of Al or Cr is deposited thereon and patterned to form a source electrode 37 and a drain electrode 38. This completes the third embodiment polysilicon TFT.

Since this third embodiment polysilicon TFT has the region 32b with a continuously varying impurity concentration and an offset region having almost no impurity ions doped therein, this third embodiment polysilicon TFT has excellent leakage current prevention. Additionally, the third embodiment requires no additional mask for the offset region.

Figure 3D:
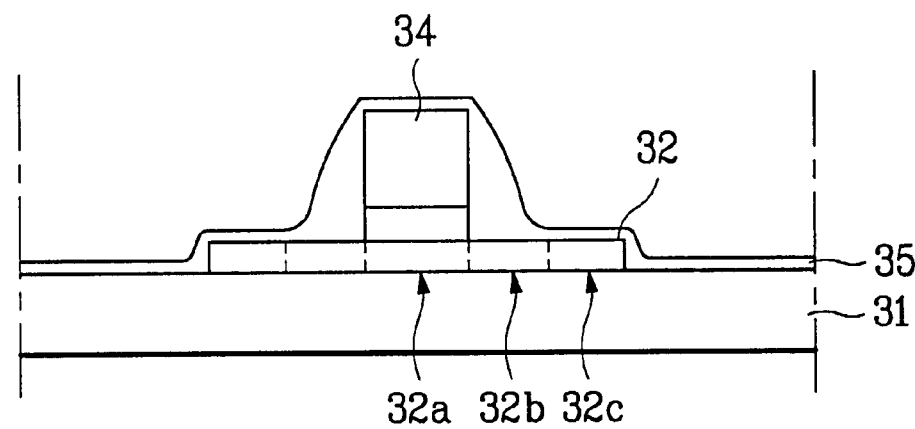

As shown in FIG. 3D, before the heavy impurity ion doping is performed, it is also possible to form the SOG layer 35 after the gate insulating film 33a and the gate electrode 34 are formed and patterned.

FIGS. 4A to 4D illustrate cross-sections of a TFT during the fabrication of a polysilicon TFT having a continuous offset structure in accordance with a fourth embodiment of the present invention.

Figure 4A:
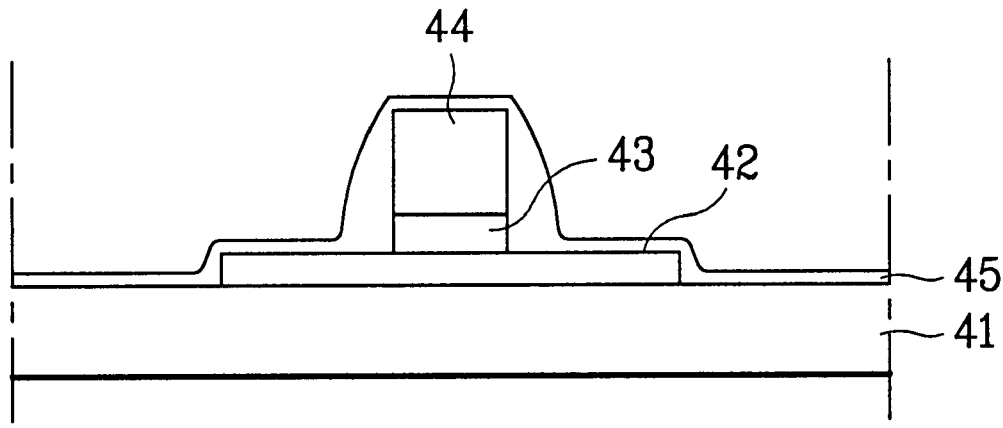
FIGS. 4A to 4D illustrate cross-sections of a TFT during the fabrication of a polysilicon TFT having a continuous offset structure in accordance with a fourth preferred embodiment of the present invention.

Referring to FIG. 4A, after an active semiconductor layer 42, a gate insulating film 43, and a gate electrode 44 are formed on a substrate 41 as in the second embodiment, MSZ is spin coated onto the structure to form an SOG layer 45. In this case, as shown in FIG. 4A, the SOG layer 45 is thicker near the gate electrode 44, acheiving a thickness almost the same as the thickness of the gate electrode 44 at the side of the gate electrode, and thinner away from the side, until it is approx. 200 Å at the peripheral portions of the active semiconductor layer.

Figure 4B:
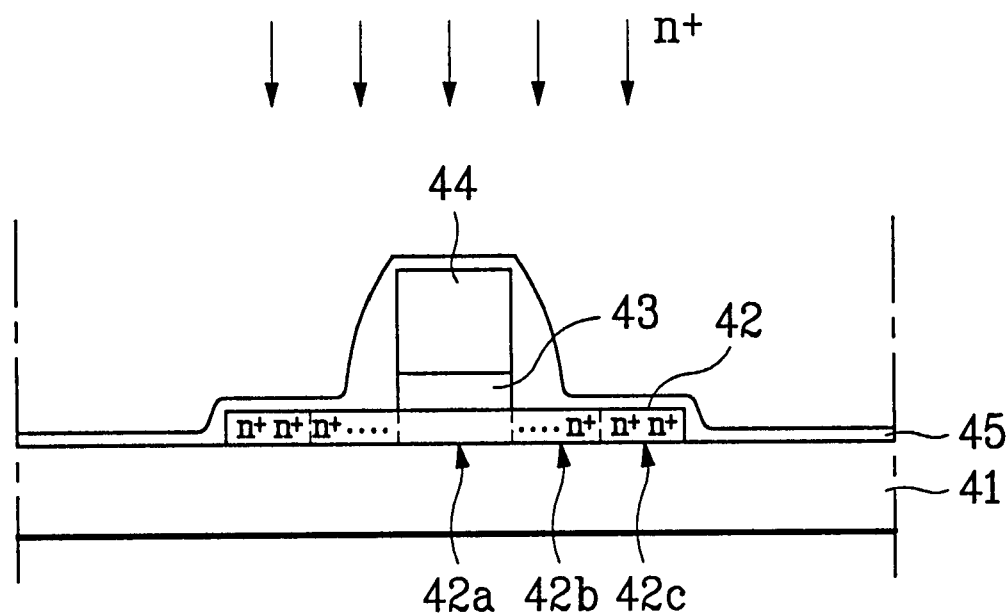

Then, as shown in FIG. 4B, an n+ doping is performed, in which impurity ions are heavily doped. The region of the active semiconductor layer 42 under the gate electrode 44 forms a channel region 42a, peripheral regions are converted into heavily doped impurity regions 42c, and between them are regions 42b that include continuously varied impurity concentrations sections and an offset section having little or no impurity ions. The regions 42b gradually turn into heavily doped impurity regions away from the gate electrode.

Figure 4C:
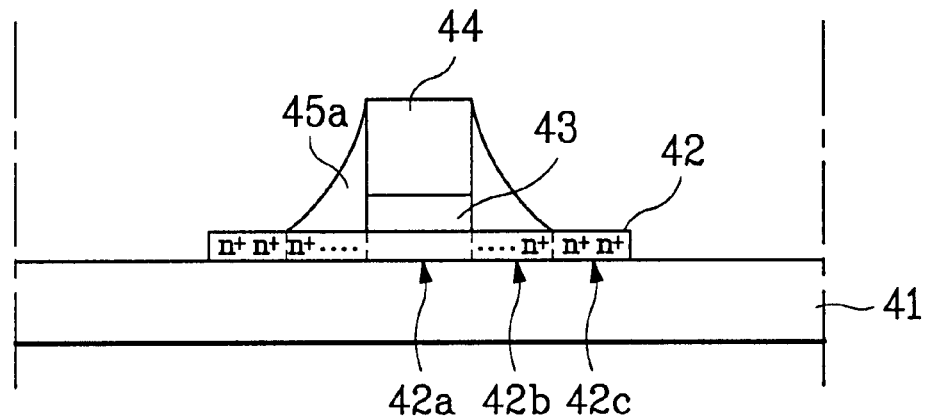
Figure 4D:
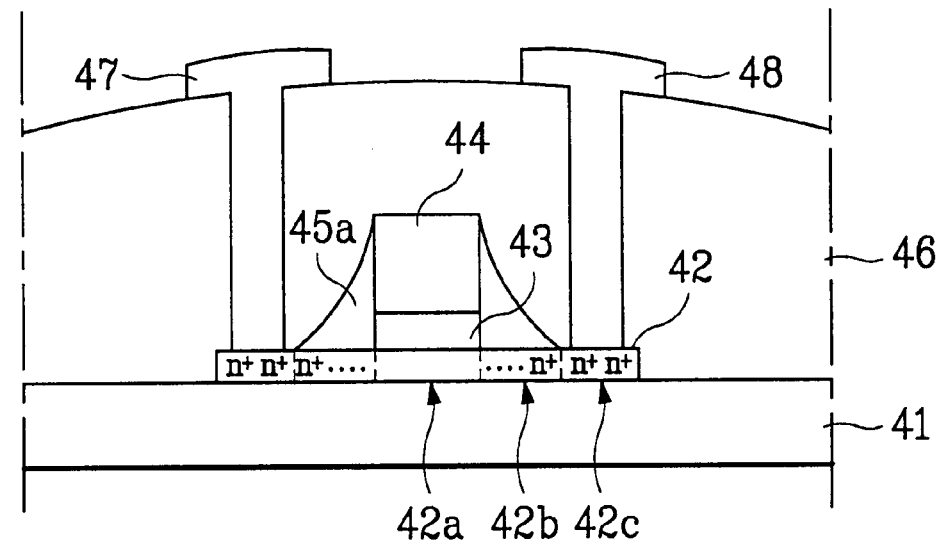

Then, as shown in FIG. 4C, an ashing process removes 200 Å of SOG, to leave an SOG layer 45a only in the regions of continuously varied impurity concentrations. Then, as shown in FIG. 4D, after conducting annealing using a laser beam, or by heat treatment, an insulating film 46 of SiOx or SiNx is formed, contact holes are formed therein, and a metal film of Al or Cr is deposited and patterned to form a source electrode 47 and a drain electrode 48. This completes the fourth embodiment polysilicon TFT.

As with the third embodiment, since the fourth embodiment polysilicon TFT has regions 42b having sections of continuously varied impurity concentrations and an offset section having almost no impurity ions doped therein, the fourth embodiment polysilicon TFT has excellent leakage current prevention. Furthermore, the fourth embodiment requires no additional mask for the offset region.

FIGS. 5A to 5D illustrate cross-sections of a TFT during fabrication of a polysilicon TFT having a continuous offset structure in accordance with a fifth embodiment of the present invention.

Figure 5A:
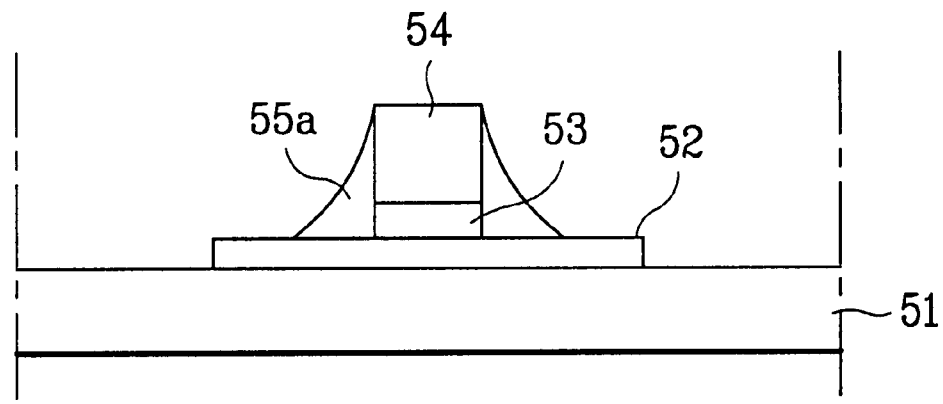
FIGS. 5A to 5D illustrate cross-sections of a TFT during the fabrication of a polysilicon TFT having a continuous offset structure in accordance with a fifth preferred embodiment of the present invention.
Figure 5B:
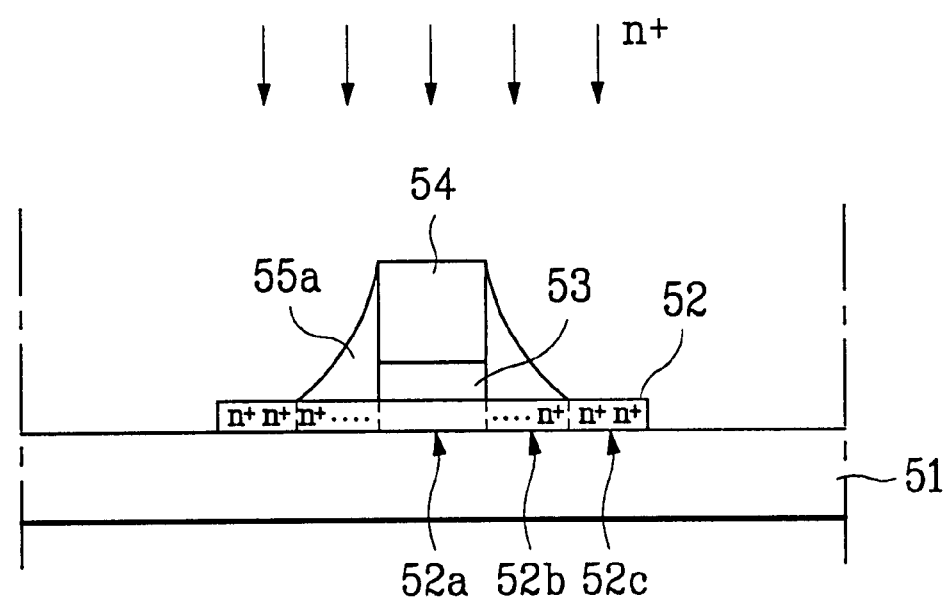

Referring to FIG. 5A, after an active semiconductor layer 52, a gate insulating film 53, and a gate electrode 54 are formed and patterned on a substrate 51, MSZ is spin coated, to form an SOG layer 55. An ashing process in a range of 200 Å is conducted, leaving the SOG layer 55 only in the region where a region 52b of continuously varied impurity concentration is intended to be formed. Then, as shown in FIG. 5B, n+ doping is performed such that the impurity ions are heavily doped. The region of the active semiconductor layer 52 under the gate electrode 54 forms a channel region 52a, peripheral regions are converted into heavily doped impurity regions 52c, and between them are regions 52b having continuously varied impurity concentrations sections and offset sections with almost no impurity ions doped. The regions 52b gradually turn into heavily doped impurity regions away from the gate electrode.

Figure 5C:
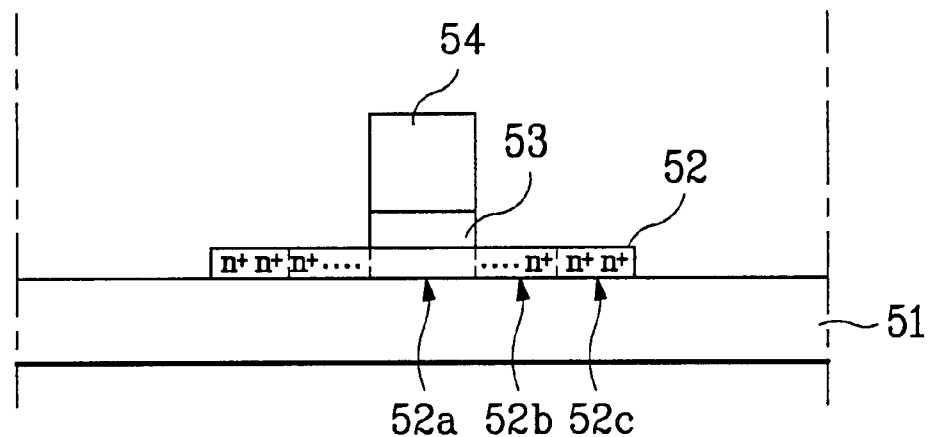
Figure 5D:
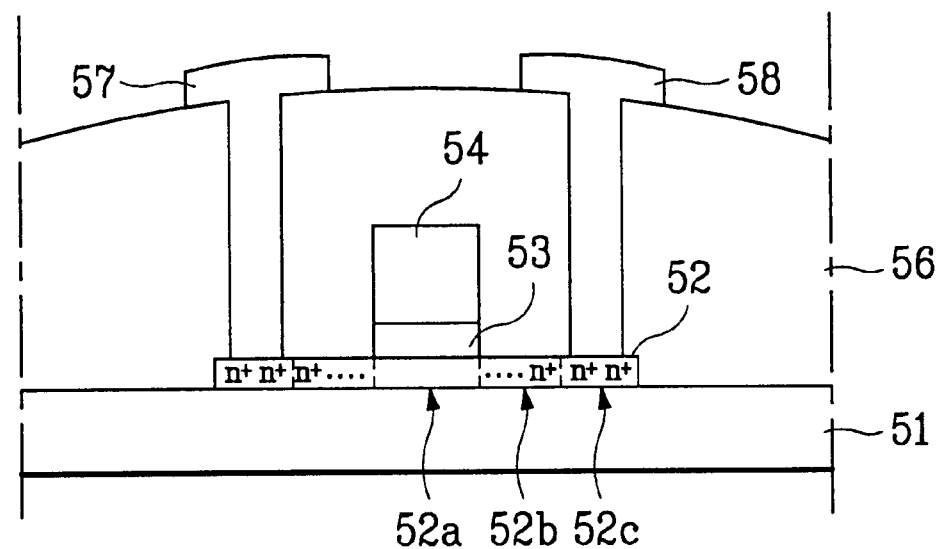

Then, as shown in FIG. 5C, the SOG layer 55 is removed. As shown in FIG. 5D, after annealing using a laser beam or by heat treatment, an insulating film 56 of SiOx or SiNx is formed thereon, contact holes are formed therein, and a metal film of Al or Cr is deposited thereon, and patterned, to form a source electrode 57 and a drain electrode 58. This completes the fabrication of the fifth embodiment polysilicon TFT.

Since the fifth embodiment polysilicon TFT has regions 52b with an offset section having almost no impurity ions and continuously varied impurity concentrations sections that gradually turned into a heavily doped impurity region away from the gate electrode, the fifth embodiment polysilicon TFT has excellent leakage current prevention. Furthermore, no additional mask is required.

As has been explained, the method for fabricating a polysilicon TFT having an LDD or an offset structure of the present invention has the following advantages. They have excellent leakage current prevention. They do not require an additional mask. Furthermore, the high heat resistance of the polysilazane spin coating layer material can prevent hillocks.

It will be apparent to those skilled in the art that various modifications and variations can be made in the method for fabricating a polysilicon TFT having an LDD or an offset structure of the present invention without departing from the spirit or scope of the invention. Thus, it is intended that the present invention cover the modifications and variations of this invention provided they come within the scope of the appended claims and their equivalents.

What is claimed is:

1. A method for fabricating a TFT(Thin Film Transistor), comprising the steps of:
   (a) forming a semiconductor layer, a gate insulating film, and a gate electrode on a substrate in succession;
   (b) forming lightly doped impurity regions in the semiconductor layer on both sides of the gate electrode;
   (c) forming an insulating film for forming a region of continuously varied impurity concentration having a thickness gradually becoming the thinner as it goes the farther to outward from both sides of the gate electrode; and,
   (d) forming heavily doped impurity regions in the lightly doped impurity regions in the semiconductor layer on both sides of the regions of continuously varied impurity concentration.

2. A method as claimed in claim 1, wherein the regions of continuously varied impurity concentration having an impurity concentration gradually varied as it goes the farther to outward from both sides of the gate electrode are formed in the semiconductor layer.

3. A method as claimed in claim 2, wherein the region of continuously varied impurity concentration has an impurity concentration which becomes the heavier as it goes the farther from each side of the gate electrodes.

4. A method as claimed in claim 1, wherein the insulating film for forming the region of continuously varied impurity concentration is formed by spin coating.

5. A method as claimed in claim 1, wherein the region of continuously varied impurity concentration is formed of polysilazane.

6. A method as claimed in claim 1, wherein the gate insulating film is formed either on an entire surface of the substrate inclusive of the semiconductor layer, or only on a region the gate electrode is to be formed thereon, selectively.

7. A method as claimed in claim 1, further comprising the step of ashing the insulating film for forming regions of continuously varied impurity concentration, to leave the regions of continuously varied impurity concentration only on both sides of the gate electrode.

8. A method as claimed in claim 1, further comprising the step of forming source/drain electrodes connected to the heavily doped impurity regions through contact holes after formation of the heavily doped impurity regions.

9. A method as claimed in claim 8, further comprising the step of removing the insulating film for forming regions of continuously varied impurity concentration after formation of the heavily doped impurity regions.

10. A method for fabricating a TFT, comprising the steps of:
   (a) forming a semiconductor layer, a gate insulating film, and a gate electrode on a substrate in succession;
   (b) forming an insulating film for forming a region of continuously varied impurity concentration having a thickness gradually becoming the thinner as it goes the farther to outward from both sides of the gate electrode; and,
   (d) forming heavily doped impurity regions in regions of the semiconductor layer except specific regions adjacent to the gate electrode by injecting impurity ions into an entire surface of above resultant.

11. A method as claimed in claim 10, wherein an offset region having no impurity ions doped heavily is formed in the specific regions adjacent to the gate electrode by the insulating film for forming regions of continuously varied impurity concentration.

12. A method as claimed in claim 10, wherein the insulating film for forming regions of continuously varied impurity concentration is formed by spin coating.

13. A method as claimed in claim 10, wherein the insulating film for forming regions of continuously varied impurity concentration is formed of polysilazane.

14. A method as claimed in claim 10, wherein the gate insulating film is formed either on an entire surface of the substrate inclusive of the semiconductor layer, or only on a region the gate electrode is to be formed thereon, selectively.

15. A method as claimed in claim 10, further comprising the step of ashing the insulating film for forming regions of continuously varied impurity concentration, to leave the regions of continuously varied impurity concentration only on both sides of the gate electrode.

16. A method as claimed in claim 10, further comprising the step of forming source/drain electrodes connected to the heavily doped impurity regions through contact holes after formation of the heavily doped impurity regions.

17. A method as claimed in claim 16, further comprising the step of removing the insulating film for forming regions of continuously varied impurity concentration after formation of the heavily doped impurity regions.

18. A method for fabricating a Thin Film Transistor, comprising the steps of:
   (a) forming a structure having a semiconductor layer, a gate insulating film, and a gate electrode on a substrate, wherein said semiconductor layer is divided into two sides by said gate electrode;
   (b) forming a lightly doped impurity region in the semiconductor layer on each side of said gate electrode;
   (c) forming an insulating film over said structure such that said insulating film has a thickness that continuously becomes thinner as the distance from said gate electrode increases; and
   (d) doping said semiconductor layer through said insulating film such that doped regions are formed having doping impurity concentrations that vary according to said thickness of said insulating film.

19. The method as claimed in claim 18, wherein said gate electrode acts as a mask during step (d).

20. A method as claimed in claim 18, wherein said doped regions have impurity concentrations that become heavier away from each side of said gate electrode.

21. A method as claimed in claim 18, wherein step (c) is performed by spin coating.

22. A method as claimed in claim 21, wherein a substance including polysilazane is spin coated.

23. A method as claimed in claim 18, further comprising a step (e) of forming source and drain electrodes, each of which connects to a doped region.

24. A method as claimed in claim 23, wherein step (e) includes steps of forming a protective layer, forming holes though said protective layer to gain access to said doped regions, depositing metal on said protective layer, in said holes, and on said doped regions, and patterning said deposited metal to said source and gate electrodes.

25. A method as claimed in claim 18, further including a step of removing said insulating film after step (d).

26. A method for fabricating a Thin Film Transistor, comprising the steps of:
   (a) forming a semiconductor layer on a substrate;
   (b) deposing a gate insulating film and a gate electrode on said semiconductor layer
   (c) patterning said gate insulating film and said gate electrode such that said gate insulating layer and said gate electrode have the same width and such that said semiconductor layer is divided into two sides by said gate electrode;
   (d) lightly doping said semiconductor layer using said gate electrode as a mask such that an undoped channel region is formed under said gate electrode and such that lightly doped impurity regions are formed on each side of said gate electrode;
   (e) forming an insulating film over said gate electrode and said semiconductor layer such that said insulating film has a thickness that continuously becomes thinner as the distance from said gate electrode increases; and
   (f) doping said semiconductor layer through said insulating film such that doped regions are formed, wherein said doped regions having doping impurity concentrations that vary according to said thickness of said insulating film.

27. A method as claimed in claim 26, wherein said doped regions have impurity concentrations that become heavier away from each side of said gate electrode.

28. A method as claimed in claim 26, wherein step (e) is performed by spin coating.

29. A method as claimed in claim 28, wherein a substance including polysilazane is spin coated.

30. A method as claimed in claim 26, further comprising a step (g) of forming source and drain electrodes, each of which connects to a doped region.

31. A method as claimed in claim 30, wherein step (g) includes steps of forming a protective layer, forming holes though said protective layer to gain access to said doped regions, depositing metal on said protective layer, in said holes, and on said doped regions, and patterning said deposited metal to said source and gate electrodes.

32. A method as claimed in claim 31, further including a step of ashing said insulating film before step (f) so as to remove insulating film from regions on each side of said semiconductor layer that are remote from said gate electrode, and wherein said remote regions of said semiconductor layer connect to said source and drain electrodes.

33. A method as claimed in claim 26, further including a step of ashing said insulating film before step (f) so as to remove insulating film from regions on each side of said semiconductor layer that are remote from said gate electrode.

34. A method as claimed in claim 26, further comprising the step of removing said insulating film after formation of said doped regions.

35. A method for fabricating a thin film transistor, comprising the steps of:
   (a) forming a semiconductor layer, a gate insulating film, and a gate electrode on a substrate, wherein said gate electrode divides said semiconductor layer into two sides;
   (b) forming an insulating film over said semiconductor layer and said gate electrode such that said insulating film become thinner away from said gate electrode; and,
   (d) forming heavily doped impurity regions in said semiconductor layer, except at specific regions adjacent to said gate electrode, by injecting impurity ions through said insulating film, wherein said doping concentrations in said heavily doped impurity regions depends upon said thickness of said insulating layer.

36. A method as claimed in claim 35, wherein an offset region without impurity ions is formed in the specific regions adjacent to said gate electrode by said insulating film.

37. A method as claimed in claim 35, wherein the insulating film is applied by spin coating.

38. A method as claimed in claim 37, wherein said insulating film includes polysilazane.

39. A method as claimed in claim 35, wherein said gate insulating film is over said semiconductor layer.

40. A method as claimed in claim 35, wherein said gate insulating film and said gate electrode have the same width.

41. A method as claimed in claim 35, further including a step of ashing said insulating film before step (d) so as to remove insulating film from regions on each side of said semiconductor layer that are remote from said gate electrode, wherein step (d) forms heavily doped impurity regions between said specific regions adjacent to said gate electrode and regions from which said insulting film is removed.

42. A method as claimed in claim 35, further comprising a step of forming source and drain electrodes, each of which connects to a heavily doped region.

43. A method as claimed in claim 42, wherein the step of forming source and drain electrodes includes steps of forming a protective layer, forming holes though said protective layer to gain access to said heavily doped regions, depositing metal on said protective layer, in said holes, and on said heavily doped regions, and patterning said deposited metal to said source and gate electrodes.

44. A method as claimed in claim 43, further including a step of ashing said insulating film before step (d) so as to remove insulating film from regions on each side of said semiconductor layer that are remote from said gate electrode, wherein step (d) forms heavily doped impurity regions between said specific regions adjacent to said gate electrode and regions from which said insulting film is removed.

45. A method as claimed in claim 35, further comprising the step of removing said insulating film after formation of said doped regions.

* * * * *